United States Patent [19]

Kery et al.

[11] Patent Number: 4,991,688

[45] Date of Patent: Feb. 12, 1991

[54] AUDIO SPEAKER SYSTEM

[76] Inventors: Ervin Kery, 1027 East Sahuaro Dr., Phoenix, Ariz. 85020; Steve A. Alverson, Springfield, Oreg.

[21] Appl. No.: 346,596

[22] Filed: May 2, 1989

[51] Int. Cl.[5] .................. H05K 5/00

[52] U.S. Cl. .................. 181/153; 181/145; 181/150; 181/154; 181/155; 181/199; 381/160

[58] Field of Search .................. 181/148, 153, 154, 199, 181/155, 144, 145, 150; 381/160

[56] References Cited

U.S. PATENT DOCUMENTS

| | | | |
|---|---|---|---|
| D. 259,786 | 7/1981 | Leeson | D14/57 |
| D. 262,793 | 1/1982 | Hathaway et al. | D14/33 |
| D. 274,056 | 5/1984 | Myer | D14/33 |
| D. 276,519 | 11/1984 | Hobrough et al. | D14/30 |
| D. 288,090 | 2/1987 | Lewis et al. | D14/30 |
| 4,200,170 | 4/1980 | Williams, Jr. | 181/155 |

*Primary Examiner*—Benjamin R. Fuller
*Attorney, Agent, or Firm*—Jerry T. Kearns

[57] ABSTRACT

An audio speaker system includes a pair of satellite speakers each having a copper lined pyramidal enclosure formed by four side walls diverging outwardly upwardly from a downwardly facing apex. A speaker mounting support at an upper end of each of the satellite speaker enclosures has a horizontal upper surface through which an upwardly facing speaker is mounted. A plurality of upwardly and inwardly inclined walls connect an upper end of each of the triangular side walls of the satellite speaker enclosures with the horizontal upper surface. A pyramidal speaker grill having four triangular side walls tapering to an upper apex covers the horizontal upper surface and is supported by the inclined walls. A sub-woofer speaker includes a pyramidal enclosure lined with a thin sheeting of copper and has four triangular side walls tapering to an upwardly facing apex. A horizontally extending speaker mounting support is formed at a lower end of the sub-woofer enclosure and a downwardly facing speaker is mounted through the horizontal speaker mounting support.

16 Claims, 4 Drawing Sheets

AUDIO SPEAKER SYSTEM

BACKGROUND OF THE INVENTION

1. Field of the Invention

The present invention relates to audio speaker systems, and more particularly pertains to an audio speaker system of the type utilized in stereo systems. Conventionally produced audio speaker systems include various different shapes of enclosures which each have tweeter, midrange and woofer speakers. These conventional enclosures are directional and the speakers must be oriented in a specific configuration with respect to an intended listener seating area. These conventional speakers utilize enclosures formed from wood, plastic and fiber board materials. These enclosures tend to dampen the sound produced by the enclosed speakers. In order to overcome these problems, the present invention provides a pyramidal enclosure having four triangular inclined walls lined with a thin copper sheeting to reflect produced sound in all directions.

2. Description of the Prior Art

Various types of audio speaker systems are known in the prior art. A typical example of such a audio speaker system is to be found in U.S. Design Pat. No. 259,786, which issued to F. Leeson on July 7, 1981. This patent discloses a hexagonal conferencing telephone unit. U.S. Design Pat. No. 262,793, which issued to D. Hathaway et al on Jan. 26, 1982, discloses a loud speaker enclosure having four inclined trapezoidal side walls. A pair of speakers are mounted through one of the tapering trapezoidal side walls and thus produce a directional type speaker. U.S. Design Pat. No. 274,056, which issued to F. Myer on May 29, 1984, discloses a pyramidal speaker enclosure having four inclined triangular side walls intersecting at an upper apex. U.S. Design Pat. No. 276,519, which issued to G. Hobrough et al on Nov. 27, 1984, discloses an elongated vertically upstanding speaker enclosure having six intersecting rectangular vertical side walls. U.S. Design Pat. No. 288,090, which issued to L. Lewis et al on Feb. 3, 1987, discloses an audio speaker frame formed from a plurality of intersecting strut members.

While the above mentioned devices are directed to audio speaker systems, none of these devices disclose an audio speaker enclosure lined with a copper sheeting and including four triangular side walls intersecting at an apex. Additionally, none of the aforesaid devices contemplate the provision of a pyramidal speaker grill in conjunction with an oppositely facing pyramidal speaker enclosure. Inasmuch as the art is relatively crowded with respect to these various types of audio speaker systems, it can be appreciated that there is a continuing need for and interest in improvements to such audio speaker systems, and in this respect, the present invention addresses this need and interest.

SUMMARY OF THE INVENTION

In view of the foregoing disadvantages inherent in the known types of audio speaker systems now present in the prior art, the present invention provides an improved audio speaker system. As such, the general purpose of the present invention, which will be described subsequently in greater detail, is to provide a new and improved audio speaker system which has all the advantages of the prior art audio speaker systems and none of the disadvantages.

To attain this, a representative embodiment of the concepts of the present invention is illustrated in the drawings and includes a pair of satellite speakers each having a copper lined enclosure formed by four side walls diverging outwardly upwardly from a downwardly facing apex. A speaker mounting support at an upper end of each of the satellite speaker enclosures has a horizontal upper surface through which an upwardly facing speaker is mounted. A plurality of upwardly and inwardly inclined walls connect an upper end of each of the triangular side walls of the satellite speaker enclosures with the horizontal upper surface. A pyramidal speaker grill having four triangular side walls tapering to an upper apex covers the horizontal upper surface and is supported by the inclined walls. A sub-woofer speaker includes a pyramidal enclosure lined with a thin sheeting of copper and has four triangular side walls tapering to an upwardly facing apex. A horizontally extending speaker mounting support is formed at a lower end of the sub-woofer enclosure and a downwardly facing speaker is mounted through the horizontal speaker mounting support.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved audio speaker system which has all the advantages of the prior art audio speaker systems and none of the disadvantages.

It is another object of the present invention to provide a new and improved audio speaker system which may be easily and efficiently manufactured and marketed.

It is a further object of the present invention to provide a new and improved audio speaker system which is of a durable and reliable construction.

An even further object of the present invention is to provide a new and improved audio speaker system which is susceptible of a low cost of manufacture with regard to both materials and labor, and which accordingly is then susceptible of low prices of sale to the consuming public, thereby making such audio speaker systems economically available to the buying public.

Still yet another object of the present invention is to provide a new and improved audio speaker system which provides in the apparatuses and methods of the prior art some of the advantages thereof, while simultaneously overcoming some of the disadvantages normally associated therewith.

Still another object of the present invention is to provide a new and improved audio speaker system which utilizes copper lined pyramidal speaker enclosures to produce nondirectional sound reproduction.

Yet another object of the present invention is to provide a new and improved audio speaker system which includes a pair of satellite speakers having pyramidal copper lined enclosures and a pyramidal sub-woofer speaker for providing realistic sound reproduction.

Even still another object of the present invention is to provide a new and improved audio speaker system which includes a pair of satellite speaker systems each having four triangular side walls intersecting at a downwardly directed apex and including an upper horizontal speaker mounting support covered by a pyramidal speaker grill.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
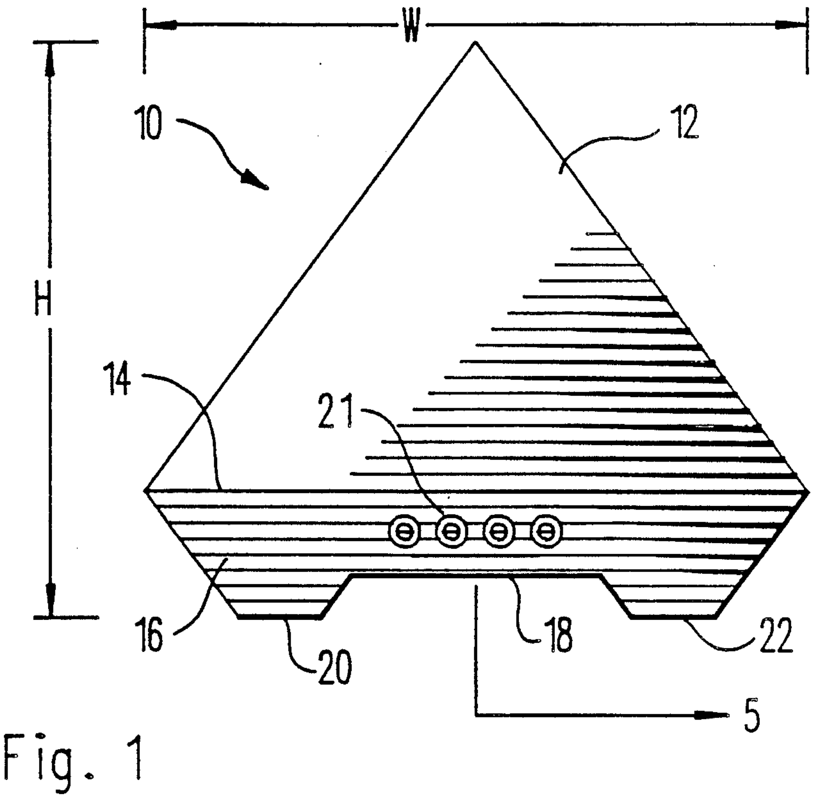
FIG. 1 is a back view illustrating the sub-woofer speaker enclosure.

With reference now to the drawings, and in particular to FIG. 1 thereof, a new and improved audio speaker system embodying the principles and concepts of the present invention and generally designated by the reference numeral 10 will be described.

More specifically, it will be noted that the first embodiment of the invention includes a sub-woofer unit 10 having a pyramidal shape formed by four triangular side walls 12 which intersect at an upwardly directed apex. A supporting assembly 16 is provided at a lower or base end 14 of the pyramidal enclosure and includes a plurality of support legs 20 and 22 separated by central recessed area 18. The support legs 20 and 22 support the sub-woofer speaker unit 10 on a floor surface in an intended listening environment. A round cut-out area 21 includes a plurality of conventional terminals for the connection of speaker wires to an enclosed speaker unit. The dimensions of the sub-woofer unit 10 may be varied within a considerable range without departing from the scope of the present invention, but a preferred value for the width W is about twenty-one inches and the height H is about twenty-two inches.

Figure 2:
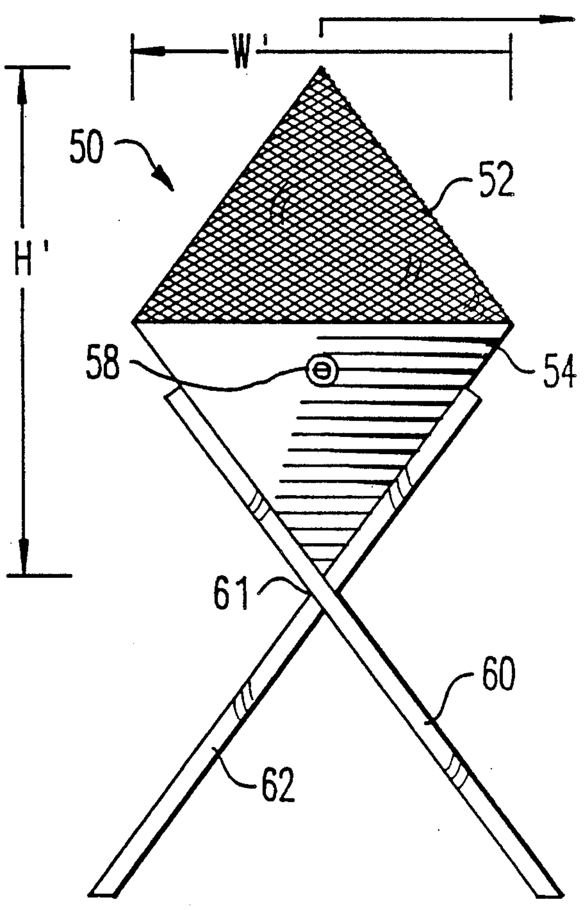
FIG. 2 is a back view illustrating one of the satellite speaker enclosures and a supporting stand.

FIG. 2 illustrates a front view of a satellite speaker unit 50 which includes a pyramidal speaker grill 52 having four triangular side walls which are inclined upwardly and inwardly to an intersection at a common upper apex. The grill 52 intersects a pyramidal enclosure 54 at a common base line 56 of the grill 52 and enclosure 54. The enclosure 54 includes four triangular side walls which are inclined downwardly and inwardly to an intersection at a common downwardly facing apex. A round cut-out area 58 includes conventional terminals for connection of speaker wires to speakers mounted within the enclosure 54. A specially designed stand for supporting the satellite speaker 50 includes a pair of intersecting elongated planar rectangular support members 60 and 62 which intersect at a point 61 forming an upwardly opening V-shaped recess dimensioned to receive the pyramidal enclosure 54. The upper ends of the planar support members 60 and 62 form inclined planar surfaces which abut opposite triangular side walls of the enclosure 54. The maximum width W' of the grill 52 and enclosure 54 is preferably about twelve inches. The combined height H' of the enclosure 54 and grill 52 is preferably about sixteen inches. The speaker system of the present invention utilizes a single sub-woofer unit 10 (FIG. 1) and a pair of satellite speaker units 50.

Figure 3:
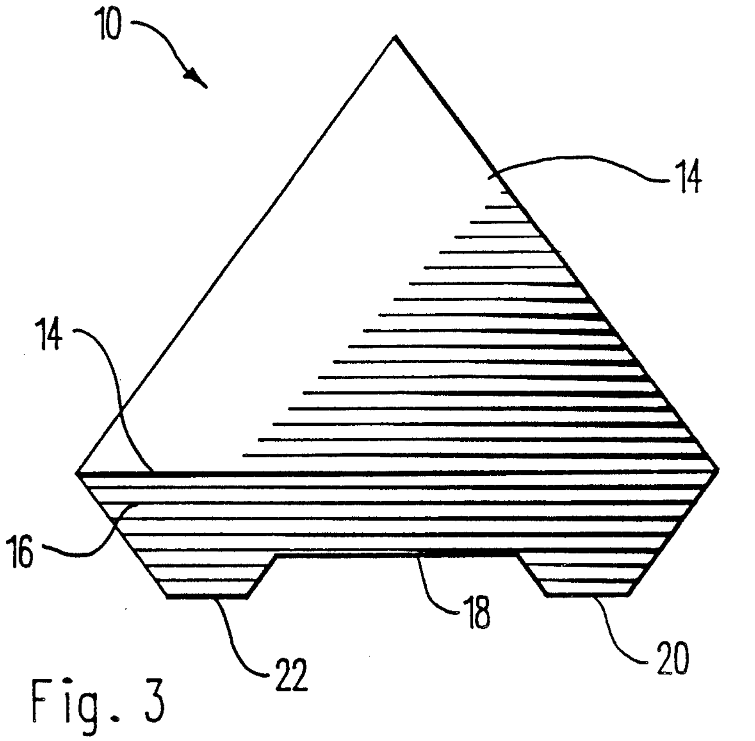
FIG. 3 is a front view of the sub-woofer unit illustrated in FIG. 1.

FIG. 3 illustrates a front view of the sub-woofer unit 10.

Figure 4:
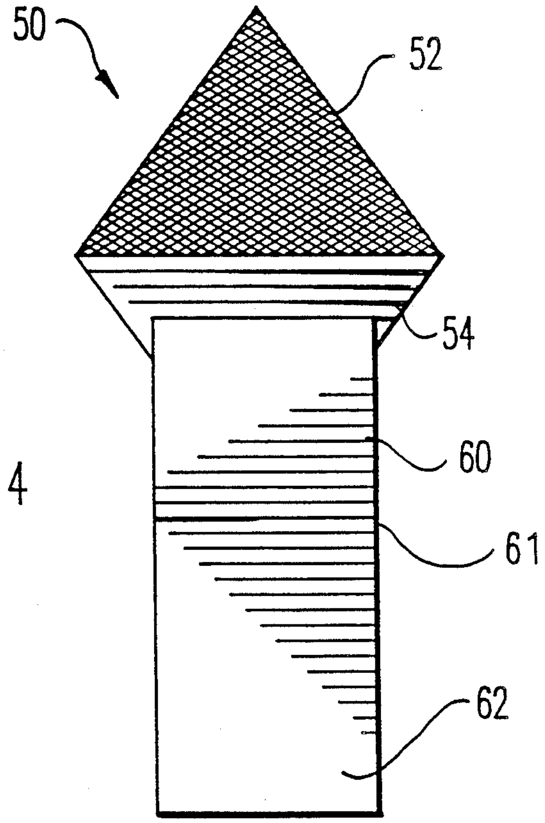
FIG. 4 is a side view illustrating the satellite speaker of FIG. 2 and supporting stand.

FIG. 4 illustrates a side view of the satellite speaker unit 50 and supporting stand.

Figure 5:
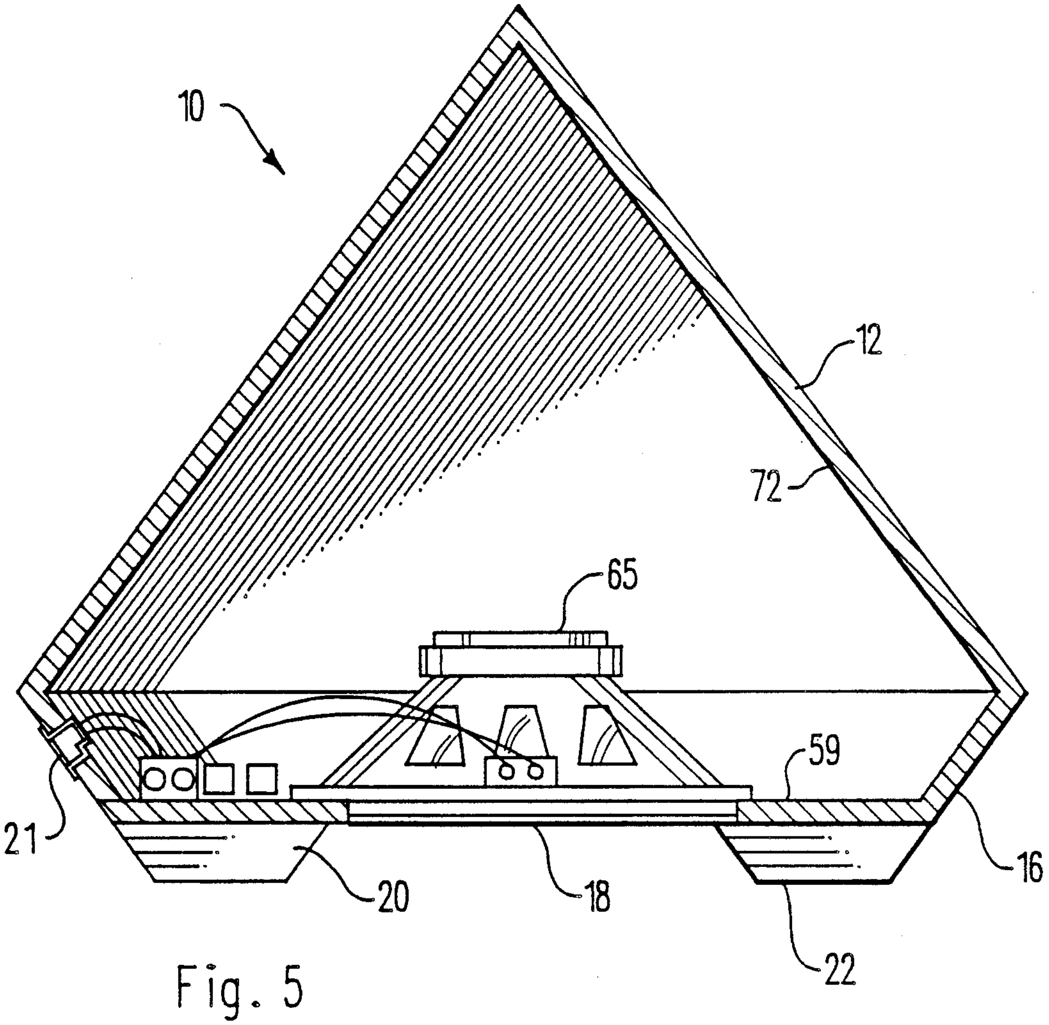
FIG. 5 is a cross sectional view, taken along line 5 of FIG. 1 illustrating the sub-woofer speaker unit.

FIG. 5 is a cross sectional view of the sub-woofer units 10. The inner surface of each of the triangular side walls 12 of the speaker enclosure include a thin copper lining 72. The enclosure walls 12 are preferably formed from a ⅝ inch thick MEDITE material lined with sixteen ounce copper sheeting. The triangular walls 12 may be covered by a decorative veneer, for example an oak veneer, and the support assembly 16 is preferably painted with a black acrylic latex for aesthetic appeal. The sub-woofer unit 10 includes a twelve inch DVC woofer 65 which may be of the type marketed under the trademark EMMENENCE MODEL NO. 12821, and having power handling capacity of one hundred and fifty watts. The sub-woofer unit 10 preferably utilizes capacitors having a value of two by one hundred uf and coils of 12 mh having a 12 db per octave slope.

Figure 6:
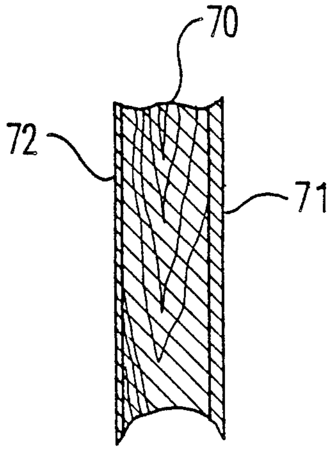
FIG. 6 is an enlarged detail view illustrating the copper lining of the speaker enclosure.

FIG. 6 illustrates a detail view which illustrates the laminated construction of the enclosure walls which includes the MEDITE layer 70, the inner copper sheeting 72 and the outer veneer layer 71.

Figure 7:
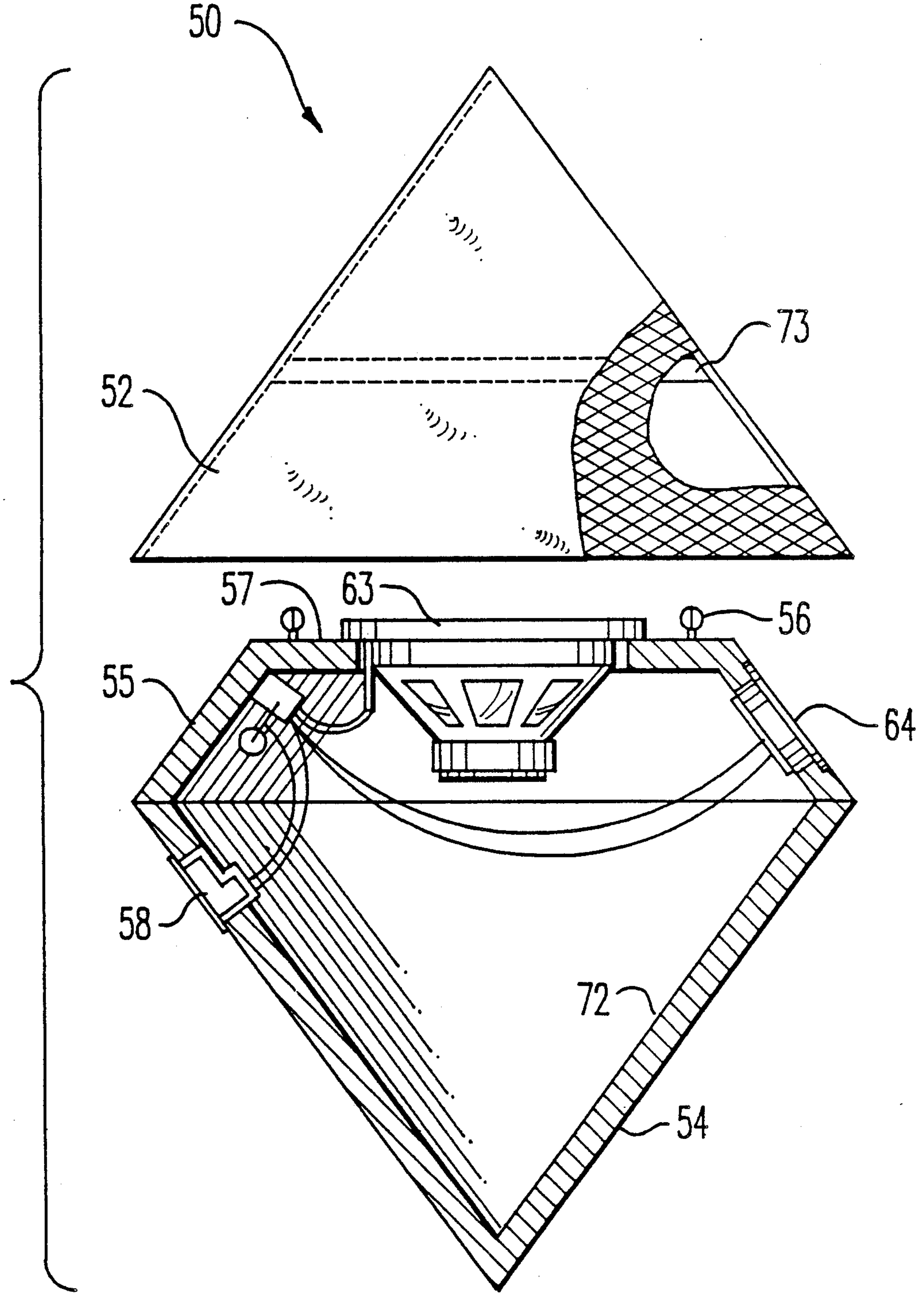
FIG. 7 is an exploded cross sectional view, taken along line 7 of FIG. 2, illustrating the construction of the satellite speaker unit.

FIG. 7 is an exploded cross sectional view which illustrates the construction of the satellite speaker unit 50. The speaker enclosure 54 is again formed of a $\frac{5}{8}$ inch MEDITE material and lined with a sixteen ounce copper sheeting 72. The triangular side walls of the enclosure 54 may be provided with an oak veneer matching that applied on the sub-woofer unit 10. The grill 52 is preferably formed from a mesh metal or plastic covered with a black fabric material. The speaker enclosure 54 includes a speaker mounting support 57 having a horizontal upper surface at an upper end of the enclosure. An upwardly facing speaker 63 is mounted through the horizontal upper surface of the mounting support 57. A plurality of upwardly and inwardly inclined walls 55 connect an upper end of each of the triangular side walls of the enclosure 54 with the horizontal upper surface 57. The inclined walls 55 are dimensioned and complementary inclined to engage and support the hollow pyramidal grill 52. A speaker grill clip 56 on horizontal upper surface 57 holds down speaker grill 52 by way of grill support board 73. The enclosure 54 additionally includes at least one speaker 64 mounted through one of the inclined walls 55. The speaker 63 is preferably a five inch midrange speaker of the type marketed under the name PEERLESS MODEL NO. 821602 having a power handling capacity of one hundred and fifty watts. The speaker 64 is preferably a one inch dome tweeter marketed under the name PEERLESS MODEL NO. 811582 having a power handling capacity of one hundred watts. Each of the speakers 63 have a 100 uf capacitor and a 0.4 mh coil with a 6 db per octave band pass. Speakers 64 have a 4 uf capacitor and a 0.5 mh coil with a 12 db per octave slope in satellite speaker unit 50. While the above components are given the preferred values, a variety of different specification speakers and speaker capacitors and coils may be utilized without departing from the scope of the present invention. The essential features include the use of the copper lining 72 in conjunction with the pyramidal shape of the enclosures.

The use of the copper lining recreates the original impact of a live performance. The pyramidal shape of the speaker enclosures create a non-directional speaker that can be placed anywhere in a room because the sound is coming through the four triangular side walls of the pyramid. This is in contrast to conventional speaker systems in which the sound is coming through either the front or sides of the speaker and require a closely adjacent room wall for bouncing off the sound. These conventional forms of speakers must be positioned adjacent a wall for proper performance. The speakers of the present invention may be placed anywhere within a room and may be suspended from the ceiling of a room as well. The satellite speaker unit 50 produce a brilliance and clarity in the mid and high frequency ranges coupled with excellent directionality in placement of performers on the sound stage which adequately match the performance capabilities of digital audio medium.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. An audio speaker, comprising:

a plurality of inclined triangular side walls intersecting at a common apex, forming a pyramidal enclosure;

at least one speaker in said enclosure; and a thin sheeting of copper lining on an interior surface of said triangular sidewalls, within said enclosure for reflecting sound produced by said at least one speaker in said enclosure.

2. The audio speaker of claim 1, wherein said enclosure has four triangular side walls diverging from a downwardly facing apex.

3. The audio speaker of claim 2, further comprising a stand for supporting said enclosure comprising a pair of inclined intersecting support members having planar inclined surfaces forming a V-shaped recess dimensioned for engagement with two triangular side walls of said pyramidal enclosure.

4. The audio speaker of claim 2, further comprising a speaker mounting support at an upper end of said enclosure, said speaker mounting support having a horizontal upper surface; and an upwardly facing speaker mounted through said horizontal upper surface.

5. The audio speaker of claim 4, further comprising an upwardly and inwardly inclined wall connecting an upper end of each of said triangular side walls with said horizontal upper surface.

6. The audio speaker of claim 5, further comprising a pyramidal speaker grill having four triangular side walls tapering to an upper apex, said speaker grill covering said horizontal upper surface and supported by said inclined walls.

7. The audio speaker of claim 5, further comprising at least one speaker mounted through one of said inclined walls.

8. The audio speaker of claim 1, wherein said enclosure has four triangular side walls tapering to an upper apex.

9. The audio speaker of claim 8, further comprising a horizontally extending speaker mounting support at a lower end of said enclosure; and a downwardly facing speaker mounted through said horizontal speaker mounting support.

10. The audio speaker system of claim 9, further comprising means on said lower end of said enclosure for supporting said horizontal speaker mounting support above a floor.

11. An audio speaker system, comprising:

a plurality of separate pyramidal speaker enclosures;

each of said pyramidal enclosures formed by a plurality of inclined triangular side walls intersecting at a common apex;

a thin sheeting of copper lining on an interior surface of each of said triangular sidewalls, within said enclosures for reflecting sound produced in said enclosures;

a first one of said speaker enclosures having four triangular side walls tapering to an upper apex, a horizontally extending mounting support at a lower end of said enclosure, a downwardly facing speaker mounted through said horizontal speaker mounting support; and a second one of said speaker enclosures having four triangular side walls diverging from a downwardly facing apex, a speaker mounting support having a horizontal upper surface at an upper end of said second enclosure, an upwardly facing speaker mounted through said horizontal upper surface.

12. The audio speaker system of claim 11, further comprising an upwardly and inwardly inclined wall connecting an upper end of each of said triangular side walls of said second enclosure with said horizontal upper surface.

13. The audio speaker system of claim 12, further comprising a pyramidal speaker grill having four triangular side walls tapering to an upper apex, said speaker grill covering said horizontal upper surface of said second enclosure and supported by said walls.

14. The audio speaker system of claim 12, further comprising at least one speaker mounted through one of said inclined walls of said second enclosure.

15. The audio speaker system of claim 11, wherein a pair of identical ones of said second enclosures are provided.

16. The audio speaker system of claim 15, wherein said first enclosure includes a sub-woofer speaker and each of said second enclosures include a midrange speaker and a tweeter speaker.

* * * * *